(12) United States Patent
Ahirwar et al.

(10) Patent No.: US 11,061,617 B2
(45) Date of Patent: Jul. 13, 2021

(54) HIGH DENSITY FRACTIONAL BIT SOLID STATE DRIVES USING CODED SET PARTITIONS

(71) Applicant: Marvell Asia Pte Ltd.

(72) Inventors: Vijay Ahirwar, Pune (IN); B Hari Ram, Chennai (IN); Sri Varsha Rottela, Visakhapatnam (IN); Nilesh N Khude, Pune (IN)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 16/796,296

(22) Filed: Feb. 20, 2020

(65) Prior Publication Data

US 2020/0264810 A1 Aug. 20, 2020

Related U.S. Application Data (60) Provisional application No. 62/808,053, filed on Feb. 20, 2019.

(51) Int. Cl.

| G11C 16/10 | (2006.01) |
|---|---|
| G06F 3/06 | (2006.01) |
| G11C 11/56 | (2006.01) |
| G11C 16/26 | (2006.01) |
| G11C 16/04 | (2006.01) |

(52) U.S. Cl.
CPC .......... G06F 3/0659 (2013.01); G06F 3/0604 (2013.01); G06F 3/0679 (2013.01); G11C 11/5628 (2013.01); G11C 11/5642 (2013.01); G11C 16/10 (2013.01); G11C 16/26 (2013.01); G11C 16/0483 (2013.01)

(58) Field of Classification Search
CPC .................................................. G11C 11/5628

USPC ..................................................... 365/785.03
See application file for complete search history.

(56) References Cited

U.S. PATENT DOCUMENTS

| 6,493,815 B1 * | 12/2002 | Kim ...................... H04L 1/0066 |
| | | 711/217 |
| 6,584,005 B1 | 6/2003 | Kato et al. |

(Continued)

OTHER PUBLICATIONS

Ungerboeck, "Channel Coding with Multilevel/Phase Signals", in IEEE Transactions on Information Theory, vol. 28, No. 1, pp. 55-67, Jan. 1982., 13 pages.

(Continued)

*Primary Examiner* — Min Huang (57) ABSTRACT

Fractional bit storage is disclosed herein which allows for storage of additional bits distributed over multiple SSD cells and maximizes data stored for SSD cells with non-binary amounts of allowable threshold voltages while minimizing required bits dedicated to error correction code (ECC). For an SSD cell with twenty-four levels of threshold voltage, set partitioning is used to create three equal subsets of levels each corresponding to eight levels of threshold voltage and each partitioned subset able to encode three bits. Each partitioned subset is designed with eight allowable threshold voltage ranges, each of which is separated from any other allowable threshold voltage range by at least two of the twenty-four levels of maximum threshold voltage. By choosing both set partitioning and assigning bit values determined via code modulation, bits stored within a partitioned subset are protected without the need for additional ECC.

20 Claims, 8 Drawing Sheets

(56) References Cited

U.S. PATENT DOCUMENTS

| | | | |
|---|---|---|---|
| 2006/0152974 A1* | 7/2006 | Bathul | G11C 11/5671 |
| | | | 365/185.03 |
| 2009/0109747 A1* | 4/2009 | Radke | G11C 11/5621 |
| | | | 365/185.03 |
| 2011/0234571 A1 | 9/2011 | Tsuchi | |
| 2013/0272071 A1* | 10/2013 | Moschiano | G11C 11/5628 |
| | | | 365/185.24 |
| 2014/0208054 A1* | 7/2014 | Parthasarathy | G11C 11/5628 |
| | | | 711/165 |
| 2015/0006791 A1* | 1/2015 | Yoo | G11C 16/10 |
| | | | 711/103 |
| 2016/0141043 A1 | 5/2016 | Lee | |
| 2020/0105340 A1* | 4/2020 | Yabe | G06F 11/1048 |

OTHER PUBLICATIONS

International Search Report and Written Opinion corresponding to International Application No. PCT/IB2020/000145 dated Jul. 31, 2020, 15 pages.

* cited by examiner

Distributed Bits

| Coded Bits | Set Partition Vector |
|---|---|
| (b0,b4,b8)=000 | A, X |
| (b0,b4,b8)=001 | A, Y |
| (b0,b4,b8)=010 | A, Z |
| (b0,b4,b8)=011 | B, X |
| (b0,b4,b8)=100 | B, Y |
| (b0,b4,b8)=101 | B, Z |
| (b0,b4,b8)=110 | C, X |
| (b0,b4,b8)=111 | C, Y |
| unused | C, Z |

402

SSD Cell A

| Coded Bits | Set | Level |
|---|---|---|
| (b1,b2,b3)=000 | A | L1 |
| (b1,b2,b3)=000 | B | L2 |
| (b1,b2,b3)=000 | C | L3 |
| (b1,b2,b3)=100 | A | L4 |
| (b1,b2,b3)=100 | B | L5 |
| (b1,b2,b3)=100 | C | L6 |
| (b1,b2,b3)=010 | A | L7 |
| (b1,b2,b3)=010 | B | L8 |
| (b1,b2,b3)=010 | C | L9 |
| (b1,b2,b3)=110 | A | L10 |
| (b1,b2,b3)=110 | B | L11 |
| (b1,b2,b3)=110 | C | L12 |
| (b1,b2,b3)=001 | A | L13 |
| (b1,b2,b3)=001 | B | L14 |
| (b1,b2,b3)=001 | C | L15 |
| (b1,b2,b3)=101 | A | L16 |
| (b1,b2,b3)=101 | B | L17 |
| (b1,b2,b3)=101 | C | L18 |
| (b1,b2,b3)=011 | A | L19 |
| (b1,b2,b3)=011 | B | L20 |
| (b1,b2,b3)=011 | C | L21 |
| (b1,b2,b3)=111 | A | L22 |
| (b1,b2,b3)=111 | B | L23 |
| (b1,b2,b3)=111 | C | L24 |

404

SSD Cell B

| Coded Bits | Set | Level |
|---|---|---|
| (b5,b6,b7)=000 | X | L1 |
| (b5,b6,b7)=000 | Y | L2 |
| (b5,b6,b7)=000 | Z | L3 |
| (b5,b6,b7)=100 | X | L4 |
| (b5,b6,b7)=100 | Y | L5 |
| (b5,b6,b7)=100 | Z | L6 |
| (b5,b6,b7)=010 | X | L7 |
| (b5,b6,b7)=010 | Y | L8 |
| (b5,b6,b7)=010 | Z | L9 |
| (b5,b6,b7)=110 | X | L10 |
| (b5,b6,b7)=110 | Y | L11 |
| (b5,b6,b7)=110 | Z | L12 |
| (b5,b6,b7)=001 | X | L13 |
| (b5,b6,b7)=001 | Y | L14 |
| (b5,b6,b7)=001 | Z | L15 |
| (b5,b6,b7)=101 | X | L16 |
| (b5,b6,b7)=101 | Y | L17 |
| (b5,b6,b7)=101 | Z | L18 |
| (b5,b6,b7)=011 | X | L19 |
| (b5,b6,b7)=011 | Y | L20 |
| (b5,b6,b7)=011 | Z | L21 |
| (b5,b6,b7)=111 | X | L22 |
| (b5,b6,b7)=111 | Y | L23 |
| (b5,b6,b7)=111 | Z | L24 |

Distributed Bits

| Coded Bits | Set Partition Vector |
|---|---|
| (b0,b1,b2,b3,b4,b5,b6,b7,b8)=000000000 | A1, A2, A3, A4 |
| (b0,b1,b2,b3,b4,b5,b6,b7,b8)=000000001 | A1, A2, A3, B4 |
| (b0,b1,b2,b3,b4,b5,b6,b7,b8)=000000010 | A1, A2, A3, C4 |
| (b0,b1,b2,b3,b4,b5,b6,b7,b8)=000000011 | A1, A2, A3, D4 |
| (b0,b1,b2,b3,b4,b5,b6,b7,b8)=000000100 | A1, A2, A3, E4 |
| (b0,b1,b2,b3,b4,b5,b6,b7,b8)=000000101 | A1, A2, B3, A4 |
| (b0,b1,b2,b3,b4,b5,b6,b7,b8)=000000111 | A1, A2, B3, B4 |
| (b0,b1,b2,b3,b4,b5,b6,b7,b8)=000001000 | A1, A2, B3, C4 |
| (b0,b1,b2,b3,b4,b5,b6,b7,b8)=000001001 | A1, A2, B3, D4 |
| (b0,b1,b2,b3,b4,b5,b6,b7,b8)=000001011 | A1, A2, B3, E4 |
| ... | ... |
| (b0,b1,b2,b3,b4,b5,b6,b7,b8)=111111111 | D1, A2, B3, B4 |
| ... | ... |
| unused | E1, E2, E3, E4 |

602

SSD Cell 1

| Coded Bits | Set | Level |
|---|---|---|
| (b9,b10)=00 | A | L1 |
| (b9,b10)=00 | B | L2 |
| (b9,b10)=00 | C | L3 |
| (b9,b10)=00 | D | L4 |
| (b9,b10)=00 | E | L5 |
| (b9,b10)=10 | A | L6 |
| (b9,b10)=10 | B | L7 |
| (b9,b10)=10 | C | L8 |
| (b9,b10)=10 | D | L9 |
| (b9,b10)=10 | E | L10 |
| (b9,b10)=01 | A | L11 |
| (b9,b10)=01 | B | L12 |
| (b9,b10)=01 | C | L13 |
| (b9,b10)=01 | D | L14 |
| (b9,b10)=01 | E | L15 |
| (b9,b10)=11 | A | L16 |
| (b9,b10)=11 | B | L17 |
| (b9,b10)=11 | C | L18 |
| (b9,b10)=11 | D | L19 |
| (b9,b10)=11 | E | L20 |

604

SSD Cell 2

| Coded Bits | Set | Level |
|---|---|---|
| (b11,b12)=00 | A | L1 |
| (b11,b12)=00 | B | L2 |
| (b11,b12)=00 | C | L3 |
| (b11,b12)=00 | D | L4 |
| (b11,b12)=00 | E | L5 |
| (b11,b12)=10 | A | L6 |
| (b11,b12)=10 | B | L7 |
| (b11,b12)=10 | C | L8 |
| (b11,b12)=10 | D | L9 |
| (b11,b12)=10 | E | L10 |
| (b11,b12)=01 | A | L11 |
| (b11,b12)=01 | B | L12 |
| (b11,b12)=01 | C | L13 |
| (b11,b12)=01 | D | L14 |
| (b11,b12)=01 | E | L15 |
| (b11,b12)=11 | A | L16 |
| (b11,b12)=11 | B | L17 |
| (b11,b12)=11 | C | L18 |
| (b11,b12)=11 | D | L19 |
| (b11,b12)=11 | E | L20 |

606

SSD Cell 3

| Coded Bits | Set | Level |
|---|---|---|
| (b13,b14)=00 | A | L1 |
| (b13,b14)=00 | B | L2 |
| (b13,b14)=00 | C | L3 |
| (b13,b14)=00 | D | L4 |
| (b13,b14)=00 | E | L5 |
| (b13,b14)=10 | A | L6 |
| (b13,b14)=10 | B | L7 |
| (b13,b14)=10 | C | L8 |
| (b13,b14)=10 | D | L9 |
| (b13,b14)=10 | E | L10 |
| (b13,b14)=01 | A | L11 |
| (b13,b14)=01 | B | L12 |
| (b13,b14)=01 | C | L13 |
| (b13,b14)=01 | D | L14 |
| (b13,b14)=01 | E | L15 |
| (b13,b14)=11 | A | L16 |
| (b13,b14)=11 | B | L17 |
| (b13,b14)=11 | C | L18 |
| (b13,b14)=11 | D | L19 |
| (b13,b14)=11 | E | L20 |

608

SSD Cell 4

| Coded Bits | Set | Level |
|---|---|---|
| (b15,b16)=00 | A | L1 |
| (b15,b16)=00 | B | L2 |
| (b15,b16)=00 | C | L3 |
| (b15,b16)=00 | D | L4 |
| (b15,b16)=00 | E | L5 |
| (b15,b16)=10 | A | L6 |
| (b15,b16)=10 | B | L7 |
| (b15,b16)=10 | C | L8 |
| (b15,b16)=10 | D | L9 |
| (b15,b16)=10 | E | L10 |
| (b15,b16)=01 | A | L11 |
| (b15,b16)=01 | B | L12 |
| (b15,b16)=01 | C | L13 |
| (b15,b16)=01 | D | L14 |
| (b15,b16)=01 | E | L15 |
| (b15,b16)=11 | A | L16 |
| (b15,b16)=11 | B | L17 |
| (b15,b16)=11 | C | L18 |
| (b15,b16)=11 | D | L19 |
| (b15,b16)=11 | E | L20 |

HIGH DENSITY FRACTIONAL BIT SOLID STATE DRIVES USING CODED SET PARTITIONS

CROSS-REFERENCE TO RELATED PATENT APPLICATION

In accordance with 35. U.S.C. § 119(e), this non-provisional patent application claims benefit of the filing date of U.S. Provisional Patent Application 62/808,053, which was filed 2019 Feb. 20. In addition, this patent application incorporates by reference the entirety of the disclosure of U.S. Provisional Patent Application 62/808,053.

FIELD OF USE

The disclosure generally relates to electrical digital data processing and error protection in solid state drives.

BACKGROUND

In solid state drives (SSD) made of flash memory that consists of floating gate NOT-AND (NAND) field-effect transistors (FETs), more high-quality storage per unit area is always desired. For quad level cells (QLC), each floating gate FET (field effect transistor) has sixteen possible threshold voltages which correspond directly to sixteen possible stored characters, and which correspond to four bits in binary. The general progression has been towards greater levels per cell, from SLC (single level cell) to MLC (multi-level cell with two bits per cell) to TLC (triple level cell). SLCs store one bit, i.e. either a 0 or a 1. MLCs store two bits per cell, i.e. one of 00, 01, 10, or 11. TLCs store three bits in eight possible combinations (where $2^3=8$). In a binary progression, five level cells with thirty-two possible levels corresponding to five bits (where $2^5=32$) would follow quad level cells (QLC).

BRIEF DESCRIPTION OF THE DRAWINGS

Aspects of the disclosure may be better understood by referencing the accompanying drawings.

DESCRIPTION

The description that follows includes example systems, methods, techniques, and program flows that embody aspects of the disclosure. However, it is noted that this disclosure may be practiced without these specific details. For instance, this disclosure refers to an SSD cell with twenty-four levels of threshold voltage in illustrative examples. Aspects of this disclosure can be instead applied to another even, nonbinary threshold level SSD architecture. In other instances, well-known instruction instances, protocols, structures and techniques have not been shown in detail in order not to obfuscate the description.

Overview

Increasing the number of allowable levels inside a floating gate NAND solid state memory cell from sixteen ($2^4$) to thirty-two ($2^5$) would greatly decrease the available range for each threshold voltage. The total amount of voltage that can be applied to a single cell is limited by dielectric breakdown voltage and heat transfer and dissipation characteristics, so voltage ranges cannot be expanded by increasing total applied voltage without causing breakdown due to dielectric failure or high temperature avalanche breakdown. Inasmuch as lower and upper voltage levels are limited, an increase in the number of intermediate levels therefore causes the threshold voltage range available for each intermediate level to decrease. As devices become smaller and more tightly packed, there is an increase in inter-cell interference as well as an increase in variability in threshold voltage due to the effects of nanoscale defects. This increase in interference—and nanoscale interface and defect contributions-causes a broadening of threshold voltage distributions as cells shrink. When threshold voltage ranges decrease as more levels are required in every cell, more and more individual cells have one or more threshold voltages that fall outside the optimal threshold voltage range. Any given cell may have one or more levels with a threshold voltage that falls outside the optimal range, i.e. inside the allowable threshold voltage range for an adjacent level ($n\pm1$), but rarely will a threshold voltage fall inside the range of a level further away (i.e. $n\pm2$). SSD devices, especially as levels increase, therefore use error correction codes (ECC) to maintain data integrity. Block codes, which are often used as ECC, use redundancy or mathematical relationships to encode a message of length k into a longer string of bits of length n, where the rate of a block code is $R=k/n$. Rates of block code approach a unity limit as fewer bits are required for data protection. ECC and other redundancy measures consume bits and occupy cells that would otherwise be dedicated to data storage, and therefore reduce total data storage capacity.

The present disclosure introduces fractional bit storage which provides for the storage of additional bits distributed over multiple SSD cells. Fractional bit storage maximizes data stored for SSD cells with non-binary amounts of allowable threshold voltages, and reduces requirements for the number of bits dedicated to error correction code (ECC), in an embodiment. For an SSD cell with twenty-four levels of threshold voltage, set partitioning is used to divide the twenty-four threshold voltage levels into three equal sets of levels in which each set corresponds to eight levels of threshold voltage and is able to encode three bits over its included levels. Set partitioning is a method by which items in a group are each assigned to one and only one disjoint subset, or partition, such that the union of all the partitions reconstitutes the original group. Each threshold voltage levels partitioned subset of the set of threshold voltage levels (hereinafter "partitioned subset") is designed with eight ($2^3$) allowable threshold voltage ranges, each of which is separated from any other allowable threshold voltage range by at least two ($n\pm2$) of the twenty-four levels of maximum threshold voltage levels. This separation eliminates interference between levels within a partitioned subset while allowing each partitioned subset to store a three-bit symbol. Set partitioning and assigning bit values to the partitioned subsets determined via code modulation inherently protects the stored bits from bit flip errors by effectively increasing the distance between threshold voltages, i.e. no bit within a partitioned subset will be misread for an adjacent bit within that same partitioned subset because misread errors over two levels are probabilistically negligible. ECC distinguishes between partitioned subsets, rather than to protect each bit within a partitioned subset, and thus can be run at a lower, more robust code rate only on the least reliable bits. Two different rates of ECC are used-one on the directly stored bits within each partitioned subset and a lower rate (where more bits are dedicated to redundancy and protection) on the distributed bits, which are the least reliable bits. The effective rate code rate is governed both by the ECC rates and by the ratio of directly written bits to distributed bits.

With the set partitioning and bit value assignments to the partitioned subsets, additional bits that exceed capacity of m memory cells are logically stored by mapping a value of the additional bits to a combination of partitioned subset identifiers corresponding to the bits values physically stored individually in the m memory cells. In the case of three bits being stored per memory cell and using two memory cells, this mapping of additional bits to partitioned subset identifiers logically distributes the additional three bits over two SSD cells resulting in 4.5 bits per memory cell (i.e., each of the two cells holds voltage assigned to a partitioned subset of the three bit value and the additional three bits are mapped to the combination of the 2 partitioned subset identifiers).

For instance, each of cells A and B contains three partitioned subsets of allowable threshold voltages, which allows information to be encoded in the nine possible permutations of chosen subsets. By mapping to eight ($2^3$) of these combinations, three additional bits may be distributed and stored over the two cells in addition to the three bits directly encoded in each cell. The three bits stored via mapping are the least reliable bits—because the levels within a partitioned subset are non-interfering but a level n misread as an nil will result in a misread partitioned subset identifier and therefore cause an error in identifying the distributed bits— and require code providing error correction. Total bits stored increases per cell as a result of the fractional bit storage to ~4.5 ($\log_2 24$) bits/cell, and total number of bits dedicated to ECC and redundancy decreases. Additional schemes for twenty level and N level cells (where N is a nonbinary even number) also allow for the same type of fractional bit storage, increasing total bits stored and decreasing need for ECC.

Example Illustrations

Figure 1:
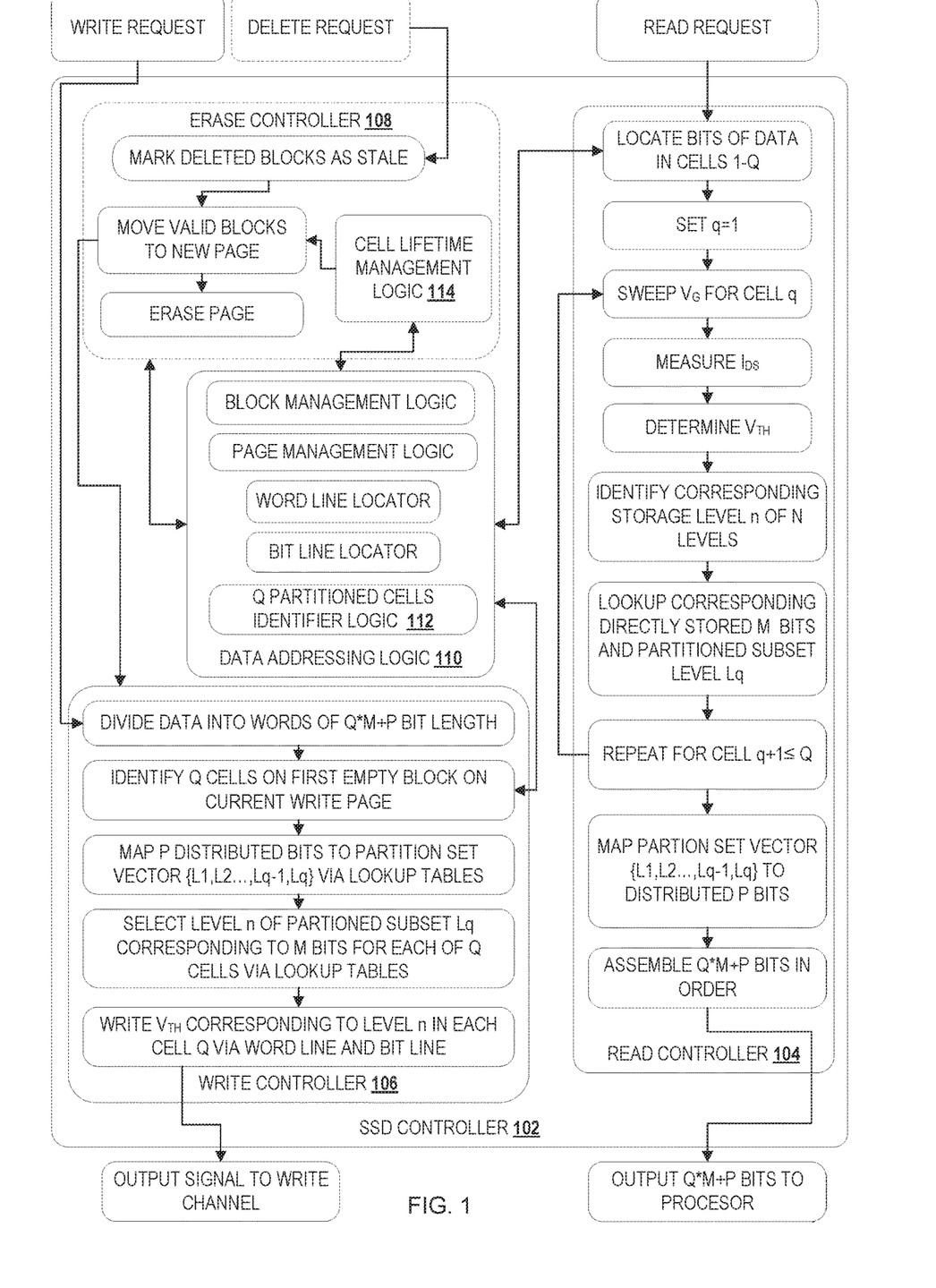
FIG. 1 depicts a diagram of selected components of a solid-state drive (SSD) controller for fractional bit storage in accordance with multiple embodiments of the disclosure.

FIG. 1 depicts a diagram of selected components of a solid-state drive (SSD) controller for partitioning and fractional bit storage. An SSD controller 102 is depicted with selected components and logical operations for level partitioning and fractional bit storage. FIG. 1 does not depict all components, circuitry, or logical operations known for an SSD controller. The SSD controller 102 contains circuitry and logical operations to read and write data bits to individual cells of the SSD, and to distribute bits across cells for storage by mapping distributed bits to partitioned subset addresses over multiple cells. The components of SSD controller 102 can be contained on the SSD itself, on a processor in communication with the SSD, or distributed between locations. Components and logical operations likewise may be distributed, in some embodiments, between SSD, SSD controller circuitry, and processor circuitry. The SSD controller 102 contains a read controller 104, a write controller 106, an erase controller 108, and data addressing logic 110. The erase controller 108 can be wholly contained inside of the write controller 106, wholly contained within the data addressing logic 110, or an independent controller as shown. The data addressing logic 110 can be a single logical unit accessed by the read controller 104, the write controller 106, and the erase controller 108, as shown in FIG. 1. The data addressing logic 110 can also be distributed among the controllers such that one or more controllers controls aspects of data addressing logic 110 and the other controllers query a lookup table, register, or logical operation to locate specific bits.

The total number of resolvable storage levels N of an individual SSD cell is governed by manufacturing restraints, i.e. die size, isolation methods, voltage step granularity, etc. For N where N is a binary number (i.e. $N=2^M$), each cell can store up to M bits. For N where N is a non-binary number (i.e. $N \neq 2^M$), each cell can store up to R bits where $2^R < N$ in the same manner as binary bits are stored by using only a binary number of levels. This method of storage eliminates storage capacity gained by increasing the resolvable levels N of a given SSD cell. However, set partitioning, which is a method of dividing the N levels into equal partitioned subsets, allows fractional bits to be stored (i.e. P whole bits stored distributed over Q cells) and therefore increases the number of bits per cell stored for values of N where N is a non-binary even number (i.e. $N=K*2^M$) to M+P/Q, where P and Q satisfy $2^P < K^Q$. By dividing the N levels into partitioned subsets, additional information or bits can be encoded by selecting a level n corresponding to a partitioned subset $L_q$, where $L_q$ is the partitioned subset identifier. A fractional bit, which is also a distributed bit, is a bit of information that is stored as a partition subset vector over a group of Q cells. The partition subset vector $\{L_1, L_2, \ldots L_{q-1}, L_q\}$ maps to a value of P bits. This means that P bits are stored distributed among Q cells, or each cell contains an additional P/Q fractional bits. The use of fractional bits requires additional logic within the read controller 104, write controller 106, and data addressing logic 110 to write fractional bits, read fractional bits, and group cells containing distributed bits together.

Write controller 106 receives write requests from the processor. The write controller 106 first divides the data into sections or words of Q*M+P bit length. Words of this length are stored together over Q cells, with bits of size M stored directly in each cell and P bits stored within a partition subset vector distributed over the Q cells. This division can be accomplished via logical operators, use of shift registers, or any other appropriate implementation. The write controller then identifies the first Q empty cells on the first empty block on the current write page. The addressing information is stored in the data addressing logic 110.

SSDs require block and page addressing architecture, where blocks are individual bits or small groups of bits and pages are groups of blocks. The write controller 106 writes to a specific cell (with a block and page address) via the appropriate bit and word lines—i.e. cells are written individually. For SSDs the erase controller 108 erases bits at the page level—i.e. cells are erased in groups at the page level. Cells cannot be overwritten, and are erased before new data is stored. Further, SSD cells have limited data storage lifetimes because the charge trapped on the floating gate dissipates over time. In order to maintain data integrity, the data addressing logic 110 together with the erase controller 108 periodically moves valid bits in valid blocks to a new page and erases the original page containing stale (i.e. marked for erasure) blocks and aging data (i.e. valid blocks approaching the end of the storage lifetime) in a process called garbage collection. Further, SSD cells degrade over each storage and erase cycle because charge injection into the floating gate strains the dielectric leading to lifetime failure. In order to maximize lifetimes for all cells, a cell lifetime management logic 114 controls which pages are written to and which pages are scheduled for erasure in order to average usage for over each cell of the SSD. When P bits are distributed over Q cells, a Q partitioned cell identifier logic 112 functions to tag or group the Q cells together so that they may be recognized by the cell lifetime management logic 114 and moved together during life cycle functions.

When P bits are distributed over Q cells, the write controller 106 writes the cells close together or in order and identifies these Q cells as a group to the data addressing logic 110 using a Q partitioned cell identifier logic 112. The Q cells can be physically separated when required by available space, such as written both at the end of a page A and at the beginning of a page B. However, physical compactness increases the speed at which distributed bits can be both written and read. The write controller 106 writes bits to empty blocks on new pages as dictated by the cell management logic 114, accomplishing compactness during the initial write. However, when the Q cells are scheduled to be re-written on a new page by the cell management logic 114, the data addressing logic 110 ensures that the grouped cells are re-written together based on an identifier, tag, or lookup table maintained by the Q partitioned cells identifier logic 112.

Q cells are selected by the data addressing logic 110, and the write controller 106 determines for each of cells $1<q<Q$ a threshold voltage $V_{th}$, where threshold voltage $V_{th}$ corresponds to bits stored in an allowed level n of the N resolvable levels of SSD cell q. The threshold voltage level n for each cell is determined both by the M bits stored directly in the cell and by the P bits stored over the group of Q cells.

For N levels cells, where $N=K*2^M$, K and M are selected such that N is divided into K equal partitioned subsets each containing $2^M$ levels (i.e. $1<n<2^M$) where each level inside a partitioned subset is separated from all other levels inside that subset by at least one intervening level (i.e. the partitioned subset contains levels no through $n_x$ where $n_0$, $n_1>n_0+1$, $n_2>n_1+1$, etc.). The separation between levels included in a partitioned subset, where no level is adjacent to any other level within the subset, prevents threshold voltage distribution errors from interfering within a partitioned subset. That is, within a partitioned subset $n_0$ and $n_1$ are not adjacent and do not have threshold voltage distributions that overlap-their threshold voltages are disjoint. The probability of threshold voltages errors exceeding one level of misreading is vanishingly small so misreading between levels separated by at least one intervening level do not require ECC protection. By further assigning bit values to each of the $2^M$ level in a partitioned subset using set partitioning and trellis code modulation (TCM), the M bits stored directly in each cell are approximated to be non-interfering. TCM—a method of error protection—involves mapping set partitions via a tree-like trellis structure and describes the assignment of bit values to threshold levels. This eliminates the need for ECC to correct errors between levels within a partitioned subset. Set partitioning will be discussed in more detail with reference to FIGS. 2, 3 and 5. Each partitioned subset (i.e. subsets 1 through K) has $2^M$ levels, and each of those levels maps to a M bit value. Both a partitioned subset identifier $L_q$, where $1 \leq L_q \leq K$, which names the subset selected for cell q and the M bit value are used to choose a value n and corresponding threshold voltage $V_{th}$ to be written to each cell q. The distributed bits P are mapped to a set partition vector $\{L_1, L_2, \ldots, L_{Q-1}, L_Q\}$ where $L_q$ is the partitioned subset identifier of cell q.

The write controller 106 determines values of n for Q cells by first mapping distributed bits P to a set partition vector $\{L_1, L_2, \ldots, L_{Q-1}, L_Q\}$ and then selecting level n included in partitioned subset $L_q$ that corresponds to M bit value. The data (or word) of $Q*M+P$ bit length is divided further into Q portions of M bit length (to be stored directly in Q cells) and distributed bits P. The stored bits are fungible, so the distributed bits can be the first P bits, the last P bits, or any selection of P bits from the $Q*M+P$ bit length (as will be discussed for FIGS. 4 and 6). For Q cells, there are $K^Q$ available permutations of the set partition vector $\{L_1, L_2, \ldots, L_{Q-1}, L_Q\}$, however not all values are used. The P partitioned bits generate $2^P$ binary bit values that are assigned to set partition vector values. The additional possible permutations of the set partition vector (i.e. $K^Q-2^P$) are unused and unassigned. The controller 106 selects a value of n for each cell q from a lookup table or any other appropriate method that correlates values of $L_q$ and M to n. The write controller 106 then determines the value of $V_{th}$. $V_{th}$ can be determined from a direct relationship with n (i.e. a direct n to voltage mathematical conversion) or, more likely, can be a function of n and both individual cell location and current SSD running conditions (i.e. lifetime degradation, etc.). The write controller 106 then outputs the write signal that corresponds to the selected threshold voltage $V_{th}$ to the write channel in order to encode $V_{th}$ in cell q.

The read controller 104 includes operations to reconstitute the bits distributed during the writing process—where these operations can consist of any combination of circuitry and logic or software level operations. When a read request is received by the write controller 104, the controller first locates the corresponding stored bits in cells by block, page, word line, and bit line. The read controller 104 queries the data addressing logic 110 to find the current storage location of the Q cells grouped by the Q partitioned cells identifier logic 112. Once the cells are identified, each of q cells (where $1<q<Q$) is read and $V_{th}$ determined. The controller then calculates n or correlates the measured $V_{th}$ to n. Once the value of n for each cell q is known, the read controller 104 determines partitioned subset identifier Lq for each cell. The read controller 104 then calculates the set partition vector $\{L_1, L_2, \ldots, L_{Q-1}, L_Q\}$ and looks up or calculates the value of the P partitioned bits based on the value of the set partition vector. Read controller 104 and write controller 106 can share lookup tables or have duplicate look up tables or other methods of correlating set partition vector $\{L_1, L_2, \ldots, L_{Q-1}, L_Q\}$ and bits P. Each cell q also stores M bits directly. The read controller 104 looks up the value of M directly from the value of n, based on a knowledge of the set partitioning and corresponding assigned M values of each n level. The read controller 104 then assembles all M bits of Q cells and P partitioned bits and reports these bits to the requesting processor.

Figure 2:
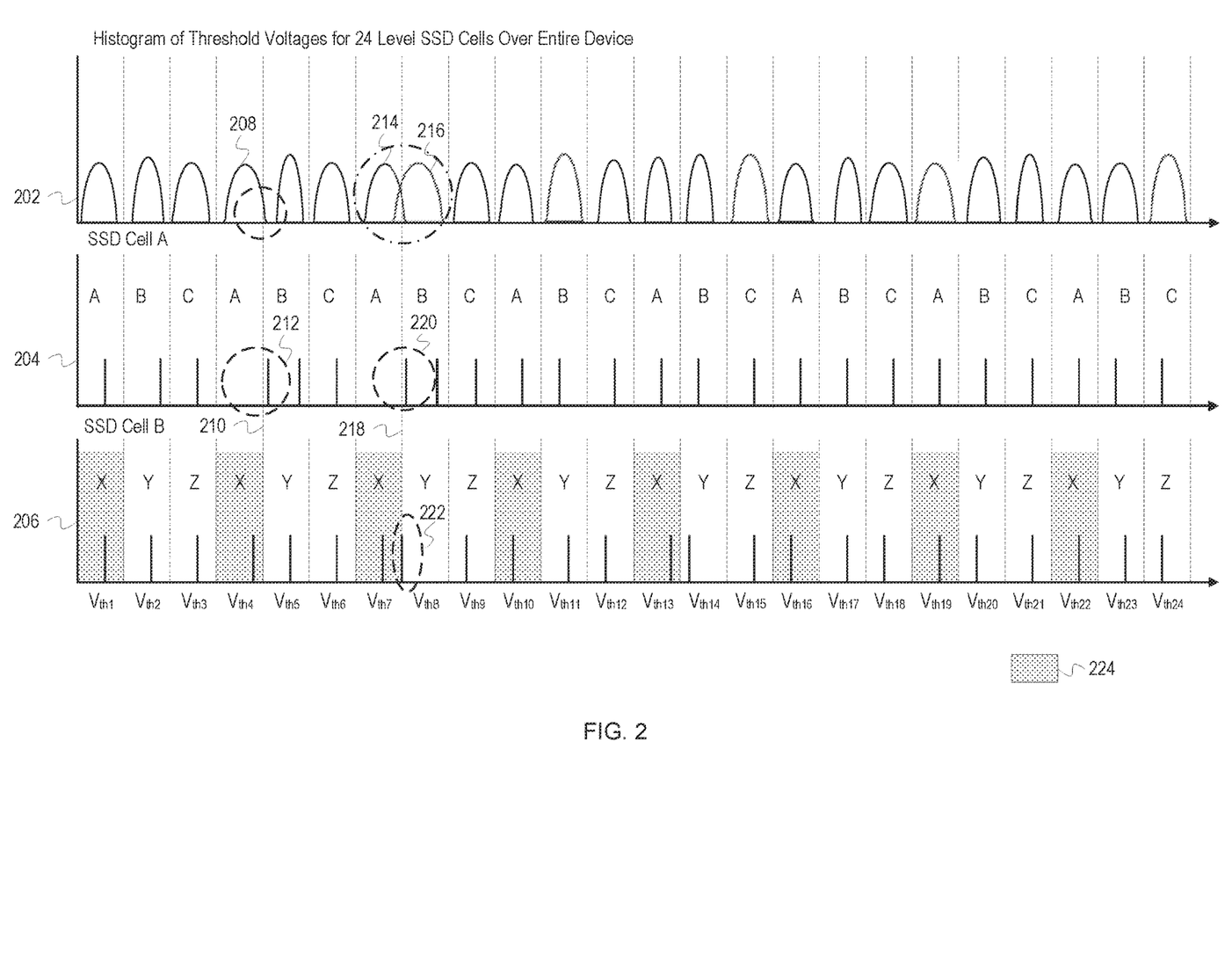
FIG. 2 depicts an example threshold voltages and threshold voltage ranges for 24-level cells in accordance with an embodiment of the disclosure.

FIG. 2 depicts example threshold voltages and threshold voltage ranges for 24-level cells. A histogram 202 of threshold voltages for many cells of an SSD device shows that while ideal threshold voltage distributions are disjoint, measured threshold voltage occasionally lie outside the correct threshold voltage range for some cells and threshold voltage. Threshold voltages for two example cells are shown: a cell A 204 and a cell B 206, selected from cells which make up the histogram 202 of threshold voltages. The threshold voltages of each cell are shown as a function of voltage together with theoretical ranges for each of the 24 levels. Each cell will have only one threshold voltage at any time (controlled by the amount of charge stored in the floating gate), but the threshold voltages for a single cell charged at each of the N levels can be shown on one graph.

The histogram 202 shows that a threshold voltage distribution for the fourth voltage level 208 has a tail that lies above a maximum threshold voltage, $V_{th4MAX}$ 210. This means that some cells of the device, due to interference effects or defects, have a $V_{th4}$ 212 that will be incorrectly read as corresponding instead to $V_{th5}$ when these cells store charge at the fourth level. The threshold voltage graph of cell A 204 shows that $V_{th4}$ 212 lies above $V_{th4MAX}$ 210 and will be incorrectly read as $V_{th5}$.

The histogram 202 also shows that the threshold voltage distributions for a seventh level 214 and an eighth level 216 are not disjoint, and both extend across a $V_{th7MAX}$ 218. This means there are cells for which $V_{th7}$ will be incorrectly read as corresponding to $V_{th8}$ and cells for which $V_{th8}$ will be incorrectly read as corresponding to $V_{th7}$. Cell A 204 is shown to be a cell for which a $V_{th7}$ 220 lies above $V_{th7MAX}$ 218 when the charge stored on its floating gate should correspond to the seventh level—$V_{th7}$ 220 will be incorrectly read at $V_{th8}$. Cell B 206 is shown to be a cell for which a $V_{th8}$ 222 lies below $V_{th7MAX}$ 218 when the change stored on the floating gate should correspond to the eighth level—$V_{th8}$ 222 will be incorrectly read as $V_{th7}$.

Errors caused by shifts in threshold voltage can be mitigated through ECC, redundancy, mapping of cells with faulty voltages, lookup tables for error correction, etc. Each of these methods requires dedicated memory space-either bits recorded on the SSD or processing space on the disk controller.

Errors most often occur due to overlaps between neighboring threshold voltage range distributions. Misreading threshold levels between ranges separated by at least one intervening threshold range or level is uncommon and need not be corrected for. In order to eliminate interference between levels, a partitioned subset of threshold voltage levels is chosen such that each level contained within the subset is at least two levels away from any other level in the subset. An example of such a partitioned subset X 224 is shown for cell B 206. In this partitioned subset, no level exhibits interference with any other level and, therefore, no ECC between levels of the subset is necessary. The levels are distinct and disjoint. For a 24-level cell, a partitioned subset X 224 can be chosen that contains eight levels each of which is separated by two intervening levels. A total of three such partitioned subsets can be chosen to account for all the levels of the cell B 206: X 224, Y, and Z. An additional group of three partitioned subsets can be chosen for all the levels of cell A 204: A, B, and C. Each partitioned subset of eight ($2^3$) levels stores three bits of non-interfering binary data. The three partitioned subsets of levels within each of the cells provide another set of coordinates that can be mapped to additional bits. Each combination of the partitioned subsets of cell A {A, B, C} and the partitioned subsets of cell B {X, Y, Z} maps to additional bit values. The nine combinations are mapped to eight ($2^3$) binary values to store three bits distributed over two cells. In this way, by writing a single threshold voltage into cell A 204 and an additional threshold voltage into cell B 206, a controller can store nine bits ($2*\log_2 5$) bits per two cells, or 4.5 bits per cell.

Figure 3:
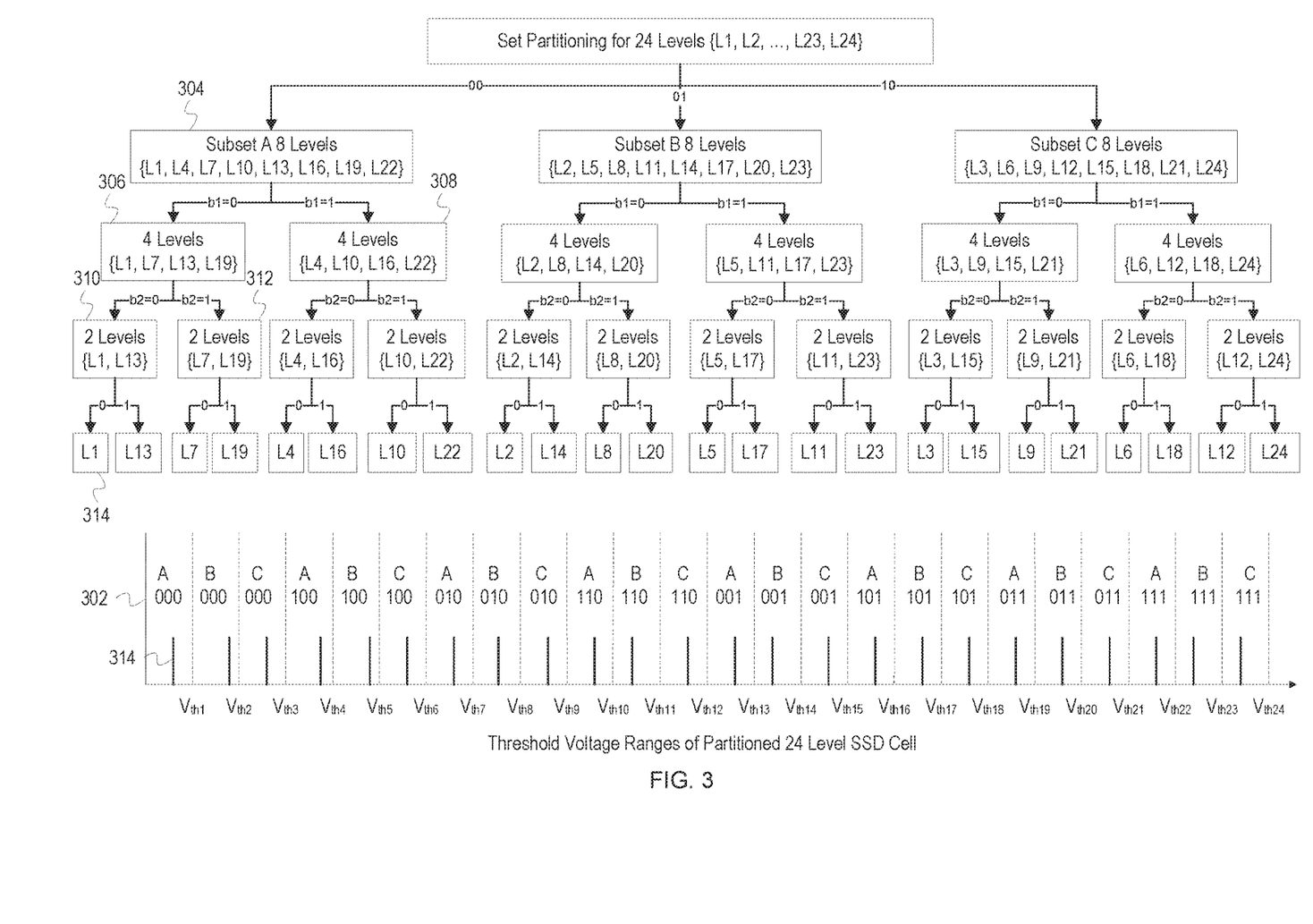
FIG. 3 depicts a partitioning scheme for a 24 level SSD cell as depicted in FIG. 2.

FIG. 3 depicts a partitioning scheme for a 24 level SSD cell. A 24-level cell is divided into three equal partitioned subsets (K=3) each containing eight levels (M=3 where $8=2^3$). The sets k where $1 \leq k \leq 3$ are labeled A, B, and C. While selecting a subset naming scheme can be arbitrary, the partitioned subset naming should be consistent. Partitioned subset identifiers can be named {A, B, C} or {00, 01, 10} or another combination as long as read and write controllers correctly map set partition vectors to the P distributed bits. Partitioned subsets A, B, and C are chosen such that each level included within a subset is separated by two intervening levels—that is a partitioned subset A 304 contains {$L_1$, $L_4$, $L_7$, $L_{10}$, $L_{13}$, $L_{16}$, $L_{19}$, $L_{22}$}, subset B contains {$L_2$, $L_5$, $L_8$, $L_{11}$, $L_{14}$, $L_{17}$, $L_{20}$, $L_{23}$} and subset C contains {$L_3$, $L_6$, $L_9$, $L_{12}$, $L_{15}$, $L_{18}$, $L_{21}$, $L_{24}$} as shown. The three partitioned subsets contain levels that are spaced by at least two threshold voltage ranges as is shown in a threshold voltage range bar graph 302. Inside of each partitioned subset, each of the eight levels corresponds to a three-bit value ($b_1b_2b_3$). These bit values are assigned via set partitioning. By selecting levels as divergent as possible for each of the bits using a method like TCM (or another appropriate partitioning method), required ECC is reduced. For eight level partitioned subsets, three levels of partitioning are performed. First, each set is divided in half by the 4 most disparate levels. Each level 1 subset contains four threshold voltage levels—for example for partitioned subset A the value $b_1=0$ is assigned to {$L_1$, $L_7$, $L_{13}$, $L_{19}$} 306 while the value $b_1=1$ is assigned to {$L_4$, $L_{10}$, $L_{16}$, $L_{22}$}) 308. Each level 1 subset is again divided in half to form two level 2 subsets. Each level 2 subset corresponds to two threshold voltage levels—i.e. for the $b_1=0$ portion of partitioned subset A the value $b_1b_2=00$ corresponds to {$L_1$, $L_{13}$} 310 while the value $b_1b_2=01$ is assigned to {$L_7$, $L_{19}$} 312, etc. Each level 2 subset is further divided in half to directly identify each threshold voltage to a three-bit value. This produces a mapping giving $b_1b_2b_3=000$ for $L_1$ 314, $b_1b_2b_3=001$ for $L_{13}$, $b_1b_2b_3=010$ for $L_7$, $b_1b_2b_3=011$ for $L_9$, $b_1b_2b_3=100$ for $L_4$, $b_1b_2b_3=101$ for $L_{16}$, $b_1b_2b_3=110$ for $L_{10}$, and $b_1b_2b_3=111$ for $L_{22}$ for partitioned subset A. Identical partitioning can be performed on each of the other subsets B and C.

Threshold voltage range bar graph 302 shows the partitioned subset identifier and three-bit value assigned to each threshold voltage $V_{th}$ value for a 24 level SSD cell. Errors requiring correction can be minimized by choosing which levels are adjacent. In graph 302, a correctly measured $V_{th3}$ corresponds to partitioned subset C and bits $b_1b_2b_3=000$. If $V_{th3}$ is erroneously low, $V_{th2}$ will be mistakenly read, where $V_{th2}$ corresponds to partitioned subset B and bits $b_1b_2b_3=000$. The substitution of portioned subset B for subset C is an error that requires ECC. However, the bits $b_1b_2b_3=000$ are still read correctly. If $V_{th3}$ is erroneously high, $V_{th4}$ will be mistakenly read, where $V_{th4}$ corresponds to partitioned subset A and bits $b_1b_2b_3=100$. The substitution of partitioned subset A for subset C is still an error that requires ECC. The bits $b_1b_2b_3=100$ are also mistakenly read in this example. However, the substitution of bits $b_1b_2b_3=100$ for bits $b_1b_2b_3=000$ is a change in the third column, i.e. it is not a single erroneous bit flip as would be the case if $V_{th4}$ corresponded to $b_1b_2b_3=001$. This error must also be protected against through ECC but is easier to detect than a single bit flip and so does not require ECC at the same strength. In this example, EEC at a rate of 0.66 low-density parity check (LDPC) is sufficient to protect the code. This is more robust than existing method which use code rates close to 0.9 to protect data integrity. A lower ECC rate allows more bits and cells to be used to store data because fewer bits must be dedicated to ECC. The distributed bits, which are the least reliable bits, can be protected at a higher rate while the directly written bits are protected at a lower rate. This causes the total code protection rate to be lower and reduces bits required for redundancy.

Figure 4:
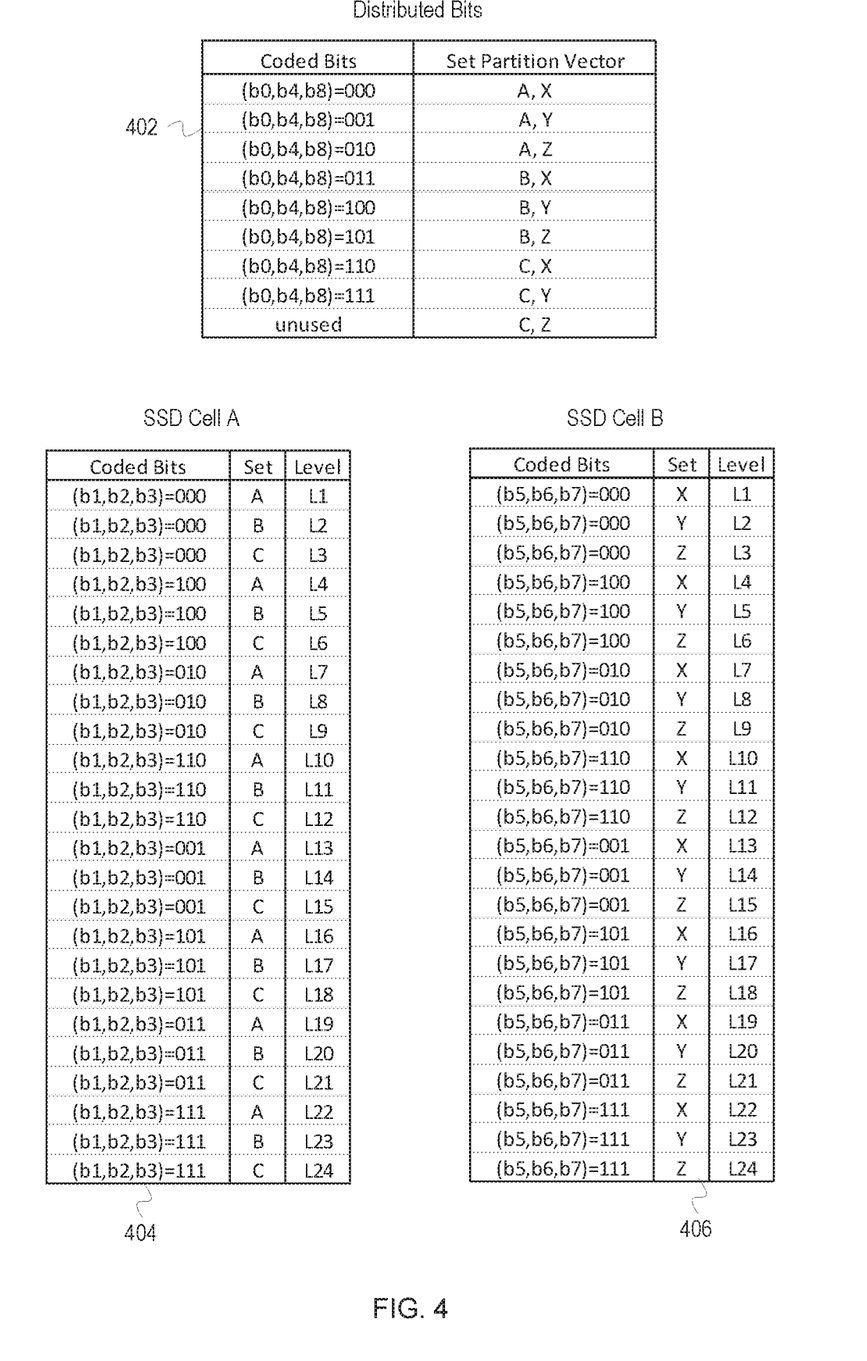
FIG. 4 illustrates bit assignment for the 24-level partitioning scheme of FIG. 3.

FIG. 4 illustrates bit assignment for a 24-level partitioning scheme over two SSD cells. In this case three bits $b_0 b_4 b_5$ are chosen as the distributed bit group. All bits in this scheme are fungible, so the members of the distributed bit group or partitioned bits can come from any part of the nine-bit string that is encoded over the two cells. Each of the two cells contains three levels, producing nine possible partitioned set vectors. Chart 402 shows the values assigned to each of the nine possible permutations of partitioned subset identifiers. Because the partitioned bits are binary (and correspond to three bits where $8=2^3$), only eight set partition vectors are assigned bit values. With reference to the partitioned illustrated in FIG. 4, when the controller writes to cell A and cell B, it writes a threshold voltage to each cell. Each threshold voltage corresponds to one of levels L1 to L24 for a 24 level cell. In order to determine the two values of n, the controller first determines a set partition vector from the distributed bits. For an example set of bits $b_0 b_1 b_2 b_3 b_4 b_5 b_6 b_7 b_8 = 101000111$ (where $b_8=1$ may be a parity bit), the distributed bits can be selected as $b_0 b_4 b_5 = 101$. The controller maps the selected bits to a set partition vector $\{L_1, L_2\}$ as shown in table 402. For the example bits $b_0 b_4 b_5 = 101$, the corresponding set partition vector is $\{B,Z\}$. This set partition vector contains the two partitioned subset identifiers, one for each cell. In this example, the controller selects threshold voltage for cell A out of the levels included in partitioned subset B as shown in table 404—the eight levels {L2, L5, L8, L11, L14, L17, L20, L23}. The controller selects threshold voltage for cell B from the levels included in partitioned subset Z as shown in table 406—the eight levels {L3, L6, L9, L12, L15, L18, L21, L24}. The controller then selects, from each of the eight levels included in the selected partitioned subset for each cell, a level n that corresponds to the non-distributed bits. For the example set of bits $b_0 b_1 b_2 b_3 b_4 b_5 b_6 b_7 b_8 = 10101111$, the directly mapped bits (i.e., non-distributed bit group) can be selected as $b_1 b_2 b_3 = 010$ for cell A and $b_5 b_6 b_7 = 011$ for cell B. The controller selects the threshold voltage for cell A from table 404, using both the partitioned subset identifier {B} and the bit value $b_1 b_2 b_3 = 010$ to select $L_8$. The controller selects the threshold voltage for cell B from table 406, using both the partitioned subset identifier {Z} and the bit value $b_5 b_6 b_7 = 011$ to select $L_{21}$. The controller then writes to cell A setting the threshold voltage that corresponds to $L_8$ and writes to cell B setting the threshold voltage that corresponds to $L_{21}$ in order to write all bits $b_0 b_1 b_2 b_3 b_4 b_5 b_6 b_7 b_8 = 101000111$.

When a controller reads cell A and cell B, it measures a threshold voltage for each cell. Each threshold voltage corresponds to one of levels $L_1$ to $L_{24}$ for the illustrated 24 level cells. The controller determines a level for each of cell A and cell B and then maps this level to both a directly coded bit and a partitioned subset identifier. If the threshold voltage of cell A corresponds to $V_{th6}$ or $L_6$, this gives a direct bit value of $b_1 b_2 b_3 = 100$ and a partitioned subset identifier C as illustrated in table 404. If the threshold voltage of cell B corresponds to $V_{th8}$ or $L_8$, this gives a direct bit value of $b_5 b_6 b_7 = 010$ and a partitioned subset identifier Y as illustrated in table 406. The set partition vector is therefore {C,Y}. The controller then accesses the mapping table 402 to determine the value of distributed bits b0b4b8. For this example resulting in the set partition vector {C,Y}, the controller returns the value 111 for $b_0 b_4 b_8$ as illustrated in table 402.

Both cells contain distributed bits and directly encoded bits. In the example shown, bits $b_1 b_2 b_3$ are encoded in cell A and bits $b_5 b_6 b_7$ are encoded in cell B. Again, because stored bits are fungible and later re-assembled, these bits can correspond to any part of the stored nine-bit word. Chart 404 shows the bit values and partitioned subset level identifiers assigned to each threshold voltage level of cell A. Chart 406 shows the bit values and partitioned subset level identifiers assigned to each threshold voltage level of cell B. Nine bits of data are stored over the two cells by selecting two threshold voltages $V_{th}$, one for each of cell A and B.

Figure 5:
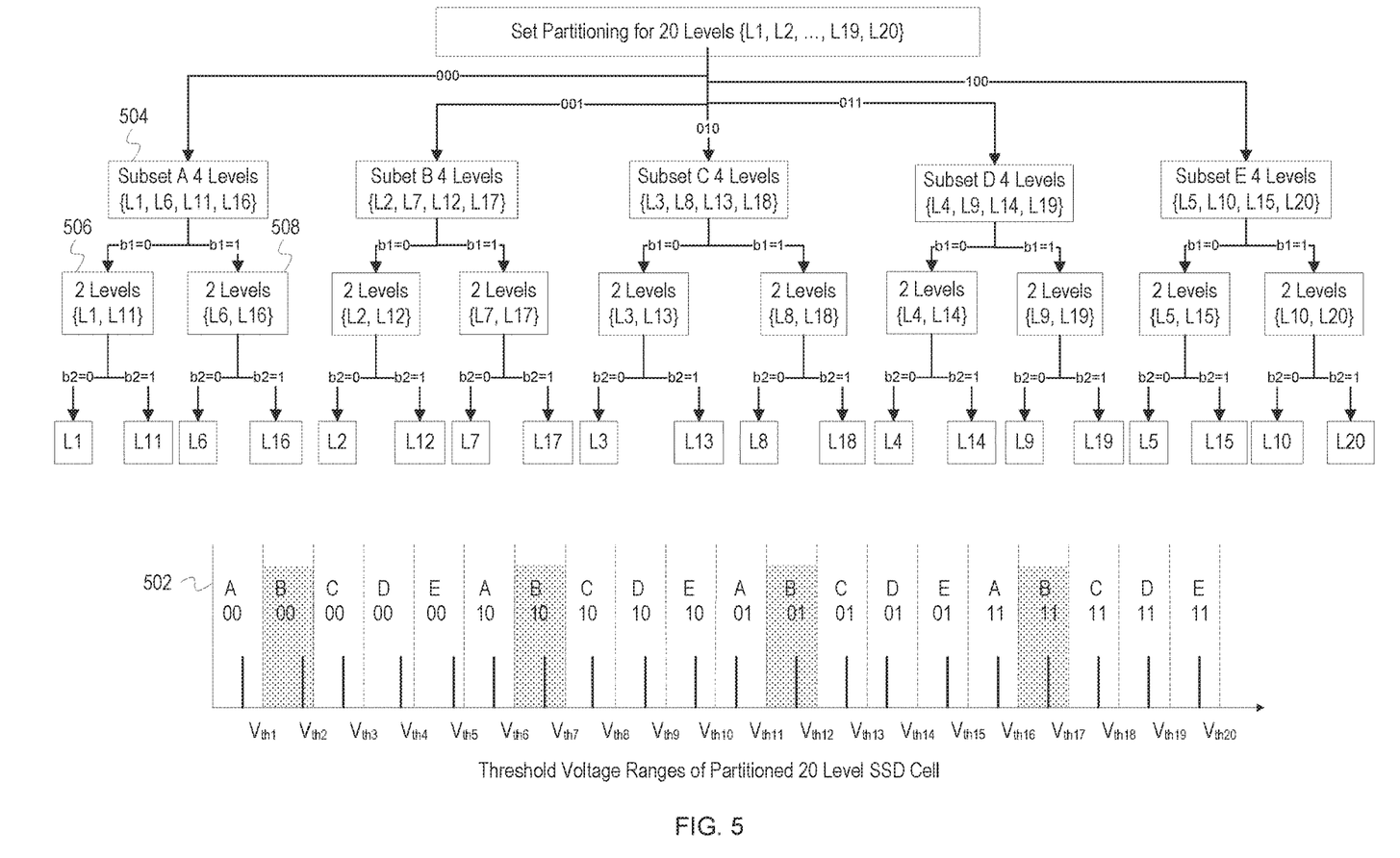
FIG. 5 depicts a partitioning scheme for a 20 level SSD cell in accordance with an embodiment of the disclosure.

FIG. 5 depicts a partitioning scheme for a 20 level SSD cell. A 20-level cell is divided into five equal partitioned subsets (K=5) each containing four levels (M=2 where $4=2^2$). The partitioned subsets k where 1<k<5 are labeled A, B, C, D, and E. Set naming consistency is required, but the partition identifiers can be named (000, 001, 010, 011, 100) instead of {A, B, C, D, E} or use any other nomenclature as long as read and write controllers can map set partition vectors to the P distributed bits. Partitioned subsets A, B, C, D, and E are chosen such that each level included with a subset is separated by four intervening levels. It is possible to choose partitioned subsets such that each level included in a subset is separated by at least one intervening level where the subsets are not evenly spaced, however choosing partitioned subsets such that the levels are as far apart as possible maintains noninterference between all levels within all subsets. Partitioned subset A 504 contains $\{L_1, L_6, L_{11}, L_{16}\}$, subset B contains $\{L_2, L_7, L_{12}, L_{17}\}$, subset C contains $\{L_3, L_8, L_{13}, L_{18}\}$, subset D contains $\{L_4, L_9, L_{14}, L_{19}\}$, and subset E contains $\{L_5, L_{10}, L_{153} L_2\}$. The five partitioned subsets contain no levels that are more closely spaced than four intervening threshold voltage ranges, as is shown in a threshold voltage range bar graph 502. Inside of each portioned subset, each of the four levels corresponds to a two-bit value ($b_1 b_2$). These bit values are assigned to each level via set partitioning-a method of designing partitioned subsets containing levels and assigning them to bit values such that each level within a subset is not misread for any other level included in the same subset. By selecting levels (which corresponds to threshold voltages) as far apart as possible for each of the bits (for example by using TCM or another appropriate partitioning method), bits stored directly in each cell are inherently protected from error and total ECC required is reduced. For four level partitioned subsets, two levels of partitioning are performed. First, each partitioned subset is divided in half into two subsets containing the most disparate levels. Each level 1 subset contains two threshold voltage levels. For partitioned subset A, the value $b_1=0$ is assigned to $\{L_1, L_{11}\}$ 506 while the value $b_1=1$ is assigned to $\{L_6, L_{16}\}$ 508. Each level 1 subset is divided again into individual threshold voltage levels. The second bit level is again assigned based on requiring that the closest two-bit value (i.e. where one bit is one count up from the previous bit 00 to 01 to 10 to 11) correspond to threshold voltages as physically disparate as possible. This produces a mapping giving $b_1 b_2=00$ for $L_1$, $b_1 b_2=10$ for $L_6$, $b_1 b_2=01$ for $L_{11}$, and $b_1 b_2=11$ for $L_{16}$ within partitioned subset A. Identical partitioning can be performed on each of the other partitioned subsets B, C, D, and E.

Threshold voltage range bar graph 502 shows the partitioned subset identifier and two-bit value assigned to each threshold voltage $V_{th}$ value for a 20 level SSD cell. The four threshold voltage levels that correspond to bits in partitioned subset B are shaded, showing how the levels within a subset are distinct and unlikely to interfere with each other. Error correction requirement are also minimized by choosing bit values for adjacent levels. In graph 502, a correctly measured $V_{th5}$ corresponds to partitioned subset E and bits $b_1b2=00$. If $V_{th5}$ is erroneously low for any reason, $V_{th4}$ will be mistakenly read where $V_{th4}$ corresponds to subset D and bits $b_1b_2=00$. The substitution of partitioned subset D for subset E is an error that must be protected against by ECC. However, the bits $b_1b_2=00$ are still read correctly. If $V_{th5}$ is erroneously high, $V_{th6}$ will be mistakenly read, which corresponds to partitioned subset A and bits $b_1b_2=10$. The substitution of partitioned subset A for subset E is still an error that requires ECC. For this case, the bits $b_1b_2=00$ are also mistakenly read as $b_1b_2=10$. However, this substitution of $b_1b_2=10$ for $b_1b_2=00$ is more than a single bit flip and is easier to detect via error detection such as TCM. In this example, EEC such as LDPC at a rate of 0.8 is sufficient to protect the code because the directly stored bits are preferentially protected from read errors. This is more robust than existing methods which use code rates close to 0.9 to protect data integrity. A lower ECC rate allows more bits to be used to store data. The 20-level partitioning scheme stores an average of 4.25 bits per cell, or seventeen bits distributed over a total of four cells. In addition to a gain of a fractional bit of storage per cell over a QLC, this method also reduces the percentage of required bits dedicated to ECC leading to additional bit storage capacity.

Figure 6:
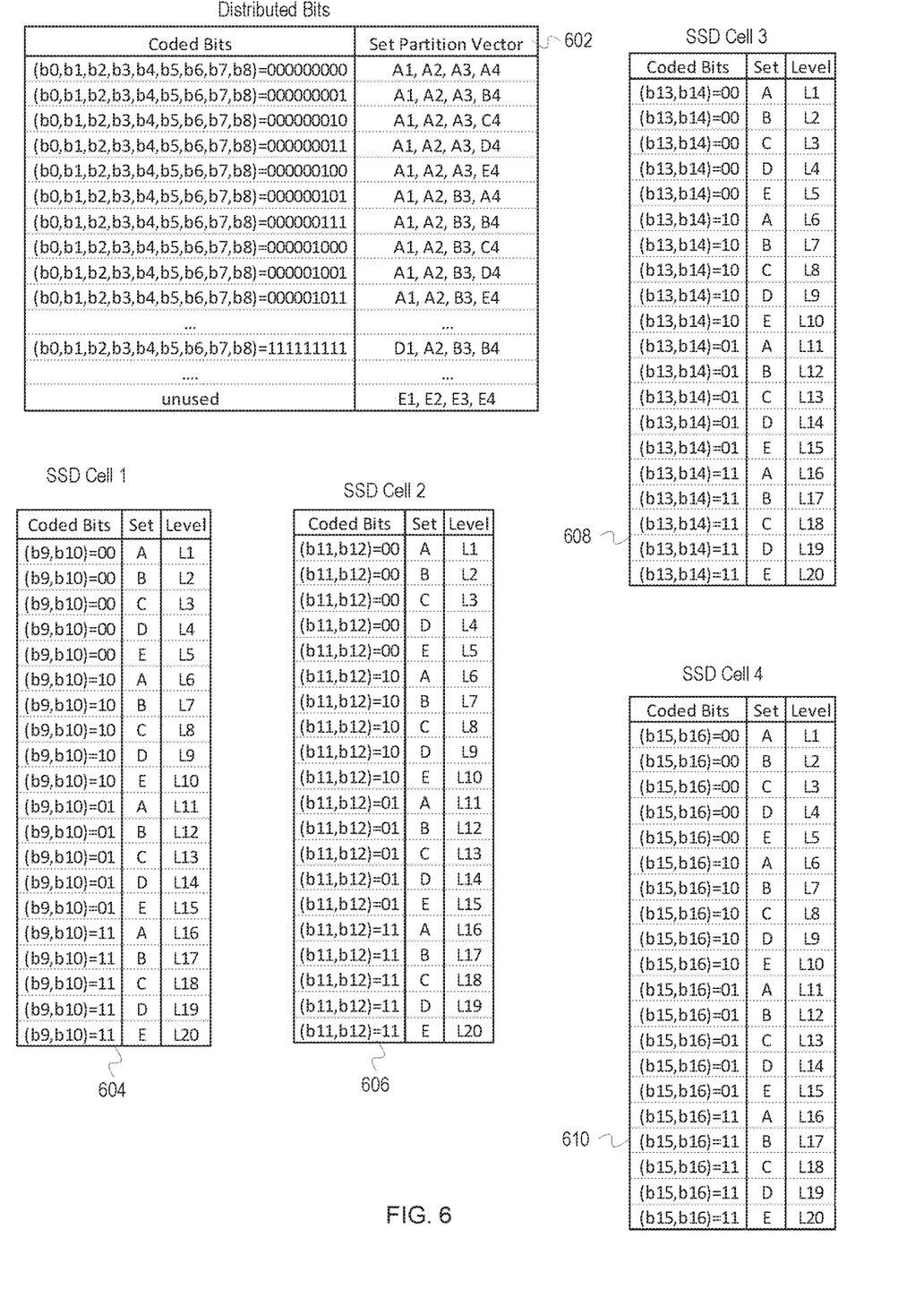
FIG. 6 illustrates bit assignment for the 20 level SSD partitioning scheme depicted in FIG. 5.

FIG. 6 illustrates bit assignment for a 20 level SSD partitioning scheme over four SSD cells. In this case nine bits $b_0b_1b_2b_3b_4b_5b_6b_7b_8$ are chosen as the distributed bits. All bits in this scheme are equivalent, so the partitioned bits can come from any part of the seventeen-bit word that is encoded over the two cells. Each of the four cells contains five levels, which produces 625 ($5^4$) possible set partition vectors. Table 602 Table 602 shows the nine-bit values assigned to the possible permutations of partitioned subset identifiers. The partitioned bits are binary, so nine bits correspond to 512 ($2^9$) possible bit values. As is shown in table 602, all bit values are mapped to set partition vectors but not all set partition vectors are assigned bit values (i.e. because 625 is larger than 512). The total number of distributed bits P is chosen such that P is as large as possible while still satisfying $2^P<K^Q$. This relationship will allow all values of the partitioned bits P to be stored while maximizing utilization.

With reference to FIG. 6 as an example for writing, when a controller writes to four 20 level cells, it writes a threshold voltage to each cell. Each threshold voltage corresponds to one of levels L1 to L20. In order to determine the four values of n (i.e. the four levels Ln), the controller first determines a set partition vector for the distributed bits. For an example set of bits b0b1b2b3b4b5b6b7b8b9b10b11b12b13b14b15b16=11111111110101100, the members of the distributed bit group or distributed bits can be selected as b0b1b2b3b4b5b6b7b8=111111111. The controller maps the selected bits to a set partition vector $\{L_1, L_2, L_3, L_4\}$ as shown in table 602. For example bits b0b1b2b3b4b5b6b7b8=111111111, the corresponding partition vector is {D1, A2, B3, B4}. The partition set vector contains four partitioned subset identifiers, one for each cell over which the bits are distributed. In this example, the controller selects threshold voltage for cell 1 out of the levels included in partitioned set D as shown in table 604, threshold voltage for cell 2 out of the levels included in subset A as shown in table 606, threshold voltage for cell 3 out of the levels included in subset B as shown in table 608, and threshold voltage for cell 4 out of the levels included in subset B as shown in table 610. The controller then selects a level n for each cell that corresponds both to the partitioned subset identifier and to the directly mapped bits. For the example set of bits, the directly mapped bits can be selected as b9b10=10 for cell 1, b11b12=10 for cell 2, b13b14=11 for cell 3, and b15b16=00 for cell 4. The controller selects the threshold voltage for cell 1 from table 604, using both the partitioned subset identifier {D} and the bit value b9b10=10 to select L9. The controller selects the threshold voltage for cell 2 from table 606, using both the partitioned subset identifier {A} and the bit value b11b12=10 to select L6. The controller selects the threshold voltage for cell 3 from table 608, using both the partition identifier (B) and the bit value b13b14=11 to select L17. The controller selects the threshold voltage for cell 4 from table 610, using both the partition identifier (B) and the bit value b15b16=00 to select L2. The controller then writes to cell 1 setting the threshold voltage that corresponds to L9, to cell 2 setting the threshold voltage that corresponds to L6, to cell 3 setting the threshold voltage that corresponds to L17, and to cell 4 setting the threshold voltage that corresponds to L2. By writing those threshold voltages, the controller stores all bits b0b1b2b3b4b5b6b7b8b9b10b11b12b13b14b15b16=11111111110101100.

When the controller reads cell 1, cell 2, cell 3, and cell 4, it measures a threshold voltage for each cell. Each threshold voltage corresponds to one of levels L1 to L20 for a 20 level cell. The controller determines a level for each of cells 1, 2, 3, and 4 and then maps each determined level to both a directly coded bit and a partitioned subset identifier. For cell 1, these values are shown in table 604. If the threshold voltage of cell 1 corresponds to Vth16 or L16, this gives a direct bit value of b9b10=11 and a partitioned subset identifier A. For cell 2, these values are shown in table 606. If the threshold voltage of cell 2 corresponds to Vth6 of L6, this gives a direct bit value of b11b12=10 and a partitioned subset identifier A. For cell 3, these values are shown in table 608. If the threshold voltage of cell 3 corresponds to Vth12 or L12, this gives a direct bit value of b13b14=01 and a partitioned subset identifier B. For cell 4, these values are shown in table 610. If the threshold voltage of cell 4 corresponds to Vth9 or L9, this gives a direct bit value of b15b16=10 and a partitioned subset identifier D. The partition set vector for this example is therefore {A1, A2, B3, D4}. The controller then accesses a mapping table to determine the value of distributed bits b0b1b2b3b4b5b6b7b8. For the above example where L16 of cell 1, L6 of cell 2, L12 of cell 3, and L9 of cell 4, the partition set vector is {A1, A2, B3, D4} and the controller returns the value b0b1b2b3b4b5b6b7b8=000001001 based on table 602. For this example, the controller then reassembles the bits into b0b1b2b3b4b5b6b7b8b9b10b11b12b13b14b15b16=00000100111100110.

All four cells contain distributed bits and directly encoded bits. In the example shown bits $b_9b_{10}$ are encoded in cell 1, bits $b_{11}b_{12}$ are encoded in cell 2, bits $b_{13}b_{14}$ are encoded in cell 3, and bits $b_{15}b_{16}$ are encoded in cell 4. All stored bits are fungible before they are reassembled into words by the read controller, so these bits can correspond to any section of the stored seventeen-bit word. Table 604 Table 604 shows the two-bit values and partitioned subset level identifiers assigned to each voltage level of cell 1. Table 606 Table 606 shows the two-bit values and partitioned subset level identifiers assigned to each voltage level of cell 2. Table 608 Table 608 shows a truncated view of the two-bit values and partitioned subset level identifiers for cell 3 and table 610 table 610 shows a truncated view of the two-bit values and partitioned subset level identifiers of cell 4. The full two-bit value and partitioned subset level identifiers are the same for all cells, only the identity of the assigned bits changes, as shown in expanded charts 604 and 606 and in chart 502 of FIG. 5. Seventeen bits of data can be stored over the four cells by selecting four threshold voltages $V_{th}$.

Examples of set partitioning are shown for 20 and 24 level SSD cells. This method is applicable to all SSD cells where N is an even number, such that $N=K*2^M$. Where N is a binary number, this method may or may not present advantages over traditional bit assignment. When N is an even non-binary number, the use of distributed bits allows greater bits storage per cell. For example, when N is 28 seven partitioned subsets (K=7) of four levels each (M=2 where $4=2^2$) bits can be distributed over 5 cells for an average storage rate of 4.8 bits per cell. When N is 32, the thirty-two levels can be partitioned such that K=4 and M=3 or such that K=8 and M=2. Because both K=4 and K=8 values are themselves binary this scheme does not require that P bits be distributed over more than one cell. However, choosing Q>1 has additional benefits for ECC gain. Additional schemes are possible, providing $N=K*2^M$ and $K^Q \geq 2^P$.

Table 1, below, shows some possible values of K, M, P, and Q for non-binary even values of N. From this table and the following flowcharts, additional schemes can be extrapolated for additional values of N and for other values of Q and P for the values of N that were already discussed.

TABLE 1

Some possible values of K, M, P, and Q for N level SSD cells

| N | K | $2^M$ | M | P | Q | Total Bits | Bits Per Cell |
|---|---|---|---|---|---|---|---|
| 20 | 5 | 4 | 2 | 9 | 4 | 17 | 4.25 |
| 24 | 3 | 8 | 3 | 3 | 2 | 9 | 4.5 |
| 28 | 7 | 4 | 2 | 14 | 5 | 24 | 4.8 |
| 32 | 8 | 4 | 2 | 3 | 1 | 5 | 5 |
| 32 | 4 | 8 | 3 | 2 | 1 | 5 | 5 |

Figure 7:
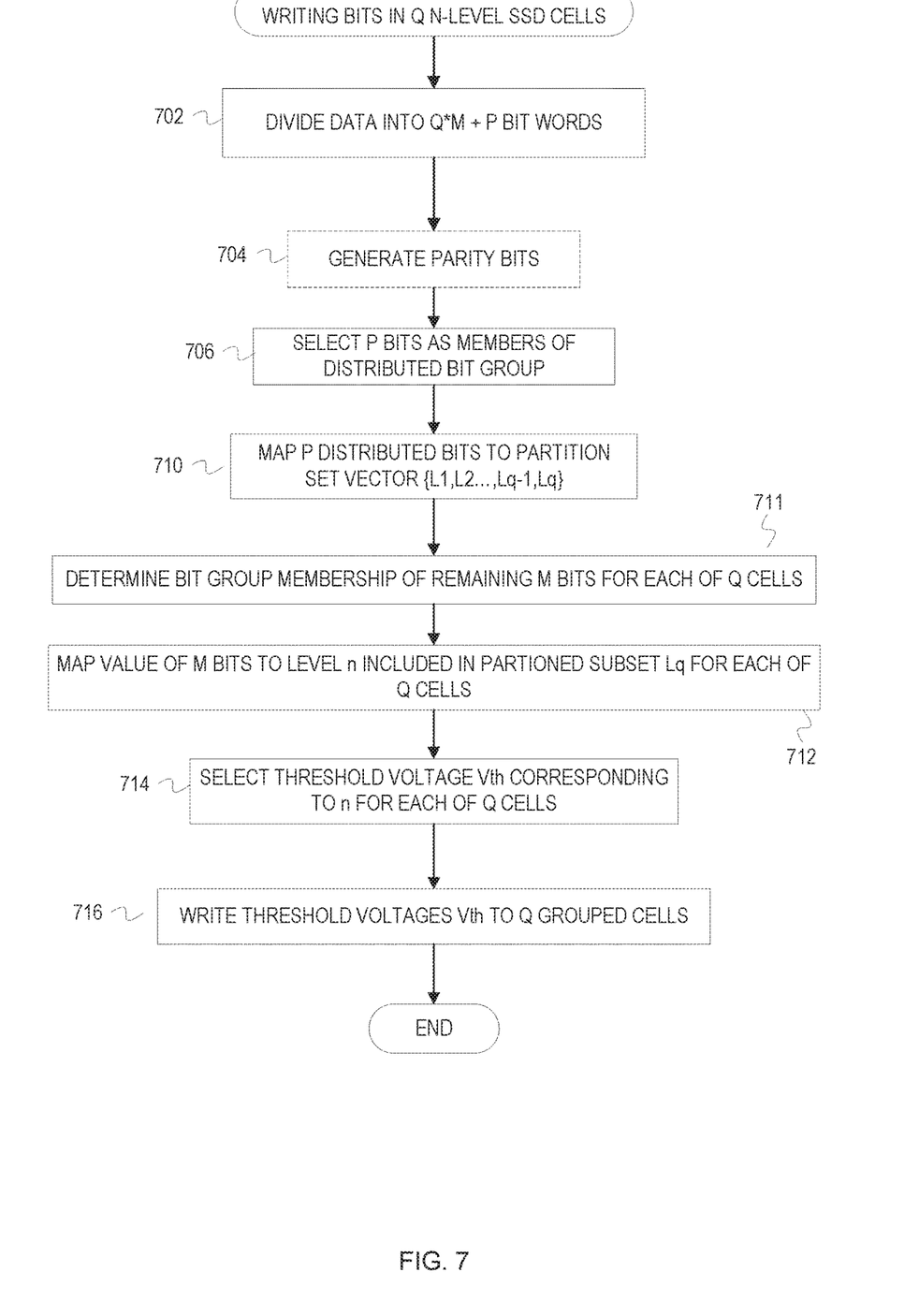
FIG. 7 is a flowchart of example operations for writing fractional bits of Q N-level SSD cells in accordance with multiple embodiments of the disclosure.

FIG. 7 is a flowchart of example operations for writing fractional bits of Q N-level SSD cells. Because the fractional bits are distributed over Q cells, all Q cells are written and grouped together.

At block 702, the data of a write request is divided into sections or words of length Q*M+P bits. Each section of data of this length will be stored together in a group of Q SSD cells. These SSD cells will be identified as a group and moved together by the SSD write controller, SSD erase controller, and any SSD cell lifetime management logic.

At block 704, optional parity bits are generated. The number of bits of data stored per group of Q cells is reduced for every parity bit generated. Parity bits allow for ECC and other data integrity measures to be performed on read bits. Any method of parity generation (LDPC, etc.) is permissible. If one parity bit is appended to each word, then words of length Q*M+P-1 will be created at block 702.

At block 706, P bits from the word created in block 702 are selected as members of the distributed bit group (also referred to as distributed bits). The P bits will be distributed across Q cells resulting in fractional bit storage. Selection of which bits within data to include in a distributed bit group and which to include in non-distributed bit groups need only be constrained by consistency. A controller can be programmed to determine group membership based on an arbitrary design choice or some other criterion determined from performance analysis.

At block 710, the value of the P distributed bits is mapped to a set partition vector $\{L_1, L_2, \ldots, L_{q-1}, L_q\}$. This set partition vector is made up of Q partitioned subset identifiers, with each of the Q partitioned subset identifiers corresponding to one of the Q memory cells to be written. The mapping of the value of the P bits to the set partition vector can be performed via a look up table or other direct mapping.

At block 711, the controller determines bit group membership for the remaining M bits from the word not selected for the distributed bit group. The controller determines bit group membership for a non-distributed bit group. As explained earlier, the controller may use predefined membership or can use a dynamic determination. For example, the controller may alternate selection of bits by word position for membership in different bit groups. for each of the cells Q.

At block 712, for each of Q cells the partitioned subset identifier $L_q$, from block 710, and the value of the M bits determined at block 711 are mapped to a level n which is included in partitioned subset $L_q$. Mapping may be via a lookup table or a logic operation may be performed.

At block 714, for each of Q cells a threshold voltage $V_t h$ is selected based on level n. The voltage $V_t h$ may have a direct mathematical relationship to n, may be based on a lookup table or other one to one correspondence value, or may be determined via a logical operation depending on n.

At block 716, a group of Q cells is physically identified in the data addressing logic and each of the Q threshold voltages $V_{th}$ are written by outputting corresponding write signals in the write channel to the correct page, block, word line, and bit line. These cells are identified in the data addressing logic as a group of Q cells and are moved together when necessary by the data addressing logic and erase controller.

Figure 8:
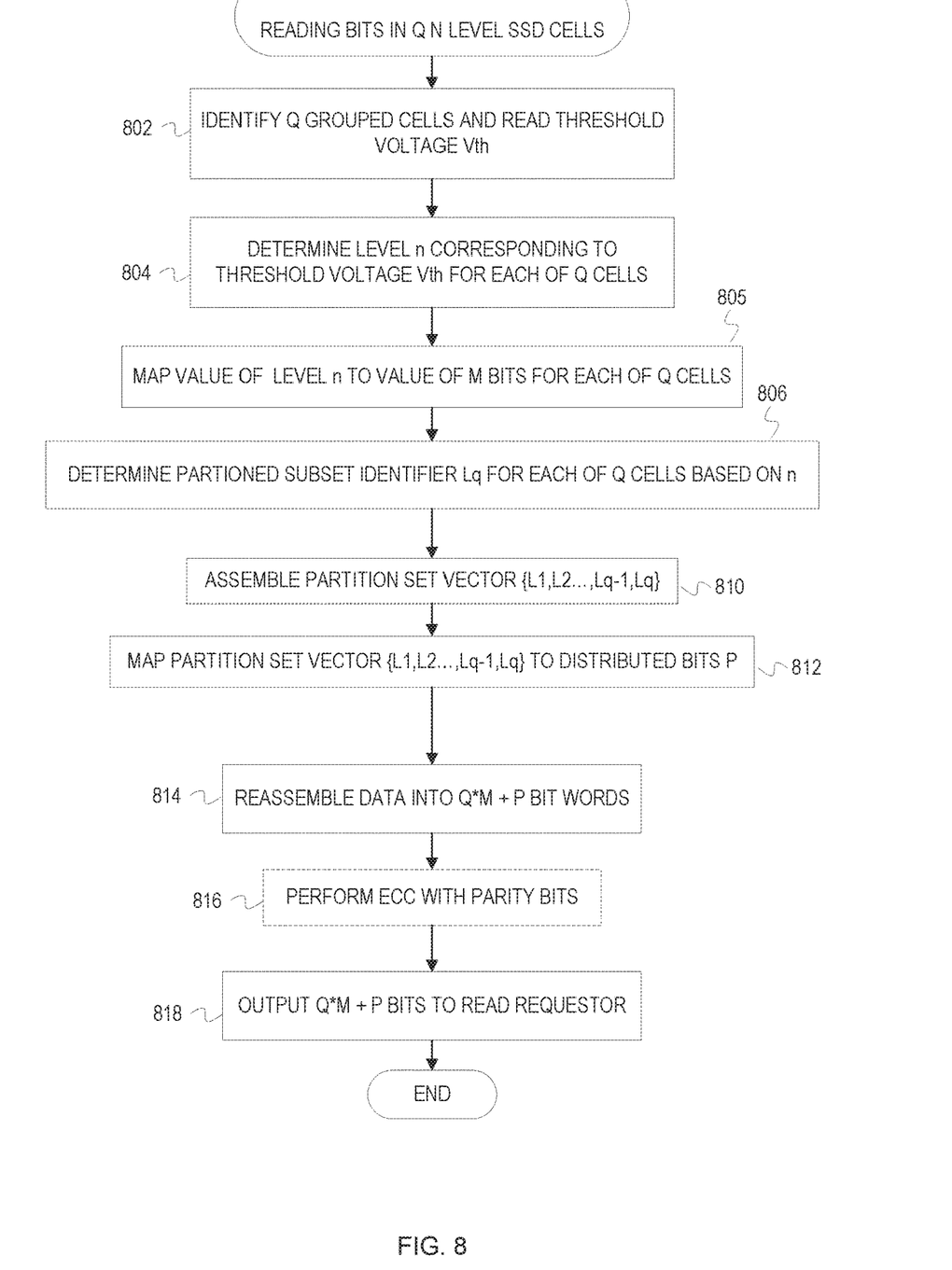
FIG. 8 is a flowchart of example operations for reading fractional bits in Q N-level SSD cells in accordance with multiple embodiments of the disclosure.

FIG. 8 is a flowchart of example operations for reading fractional bits in Q N-level SSD cells. Because the distributed bits are distributed over all Q cells, each of the Q cells must be read together.

At block 802, read logic identifies a group of Q cells which correspond to a set of Q*M+P bits and reads the Q cells. The data addressing logic tracks where each of the Q cells is located, and accesses these Q cells by page, block, word line, and bit line. These cells may or may not be in the same location where they were initially written, so the read logic must query the data addressing logic to locate the cells that correspond to the read request. Once the Q cells are identified and located, each of the cells is read by read signal addressing at page and block level by the word line and bit line. For each of the Q cells, a threshold voltage $V_{th}$ is read and recorded.

At block 804, the read logic determines a level n that corresponds to the threshold voltage $V_{th}$ for each of Q cells. The threshold voltage $V_{th}$ can correspond directly to level n, or can be mapped to level n via a look up table or other register, or read logic can determine n based on threshold voltage $V_{th}$ and other device parameters such as lifetime and physical location of cell q. From the Q values of level n, the value of the Q*M+P bits can be determined. Flow continues from block 804 to both block 806 and block 808.

At block 805, the read logic maps the value of level n to a value of M bits for each of Q cells. These bits are assigned to values of n based on level partitioning. The determination of the value of the M bits for each of Q cells is protected from interference generated errors by the set partitioning because all levels within a partitioned subset are separated by at least one intervening threshold level. Read errors where n is mistaken for n±2 are uncommon, so to a first order the value of M for the directly written bits is correct.

At block 806, from level n the read logic determines a partitioned subset identifier $L_q$. $L_q$ can be mapped from n, determined mathematically from $V_{th}$, or calculated probabilistically from n or $V_{th}$. A lookup table can be used to correlate $V_{th}$ directly to n. In order to account for changes in $V_{th}$ over time, n may be calculated from a mathematical relationship to $V_{th}$ and other operating characteristics or running times. This may include a probabilistic determination of n based on $V_t$ and degradation rates. For each of Q cells, $L_q$ is determined.

At block 810, the partitioned subset identifiers $L_q$ from each of the Q cells are assembled into a set partition vector $\{L_1, L_2, \ldots, L_{q-1}, L_q\}$. This set partition vector has Q dimensions and K possible values for each level $L_q$.

At block 812, the set partition vector $\{L_1, L_2, \ldots, L_{q-1}, L_q\}$ is mapped to a P bit value. The distributed bits are reconstituted based on the value of the set partition vector $\{L_1, L_2, \ldots, L_{q-1}, L_q\}$. These values may be related by mathematical calculation, mapping, via lookup tables or other registers, or by logical operations. From block 812, flow continues to block 814.

At block 814, the data is reassembled into a Q*M+P bit length word. Each of Q cells contains M directly written bits and P bits are distributed over all Q cells. The order of the reassembled data is dictated by the order in which the bits where written to the Q cells. Each written bit is fungible, so the order of reassembly depends only on the order of the write logic.

At block 816, any parity bits are used to perform ECC. Parity bits are optionally included in the word of Q*M+P length, and each included parity bit displaces a data bit. For any parity bits included in the word, parity check or ECC can be performed after the data bits are assembled but before the data is output to the read requestor.

At block 818, the Q*M+P bits (minus any parity bits used for ECC) are output to the read requestor. For read data longer than Q*M+P bits, multiple groups of Q cells are read and all data reassembled.

A method for encoding fraction bits, which are bits distributed over multiple cells, in SSD cells is disclosed. For SSD cells having non-binary allowable threshold levels, this method increases the stored bits per cell. For SSD cells with both binary and non-binary numbers of threshold voltage levels, this method decreases the required ECC rate because directly stored bits are protected from interference by choosing non-interfering levels during set partitioning. Various embodiments including methods, systems, logical controllers and operations are disclosed.

The invention claimed is:

1. A method for increasing the capacity of a storage drive by storing fractional bits in memory cells comprising:
based on a write request to write data to memory cells corresponding to an address indicated in the write request, determining membership of the bits that form at least a portion of the data in different groupings of the bits, wherein a first bit grouping is to be distributed across the memory cells and each remaining bit grouping is to be stored in a corresponding one of the memory cells;
based on a first value of the first bit grouping, determining a list of partitioned subset identifiers that map to the first bit grouping, wherein each partitioned subset identifier in the list corresponds to a different one of the memory cells;
for each of the remaining bit groupings and the corresponding one of the memory cells,
determining which of a set of voltage threshold levels maps to both a value of the remaining bit grouping and the partitioned subset identifier for the memory cell in the list, wherein the set of voltage threshold levels have been partitioned into set partitions each of which is identified by a different partitioned subset identifier for each of the memory cells; and
writing to the memory cell a voltage threshold corresponding to the determined voltage threshold level.

2. The method of claim 1 further comprising:
based on a read request to read data from an address, reading memory cells corresponding to the address and determining a voltage threshold level based on the reading;
determining values for memory cell specific bit groupings that map to the voltage threshold level;
for each read memory cell, determining a partitioned subset identifier that maps to the voltage threshold level determined from the reading;
mapping the determined partitioned subset identifiers in aggregate to a value for a distributed bit grouping value; and
assembling the determined values and the value for the distributed bit grouping into a word for the read request.

3. The method of claim 1 wherein determining membership of the bits that form at least a portion of the data in different groupings of the bits comprises accessing a set of one or more tables that defines grouping by bit position.

4. The method of claim 3 further comprising defining bit groupings by bit position.

5. The method of claim 1 further comprising partitioning the set of voltage threshold levels to prevent adjacent voltage threshold levels from being within a same partitioned subset.

6. The method of claim 1, wherein determining membership of the bits that form at least a portion of the data in different groupings of the bits comprises dividing the data into words each having Q times M plus P bits per word, wherein Q is the number of memory cells, P is a number of bits in the first bit grouping, and M is the number of bits that can be stored in each of the memory cells.

7. The method of claim 6 further comprising determining P to satisfy $2^P < K^Q$, wherein N is a number of resolvable voltage threshold levels for each of the memory cells and wherein N=K*2M.

8. The method of claim 1 further comprising determining the voltage threshold corresponding to the determined voltage threshold level.

9. A system comprising:
a processor; and
a solid state storage device configured to:
based on a write request to write data to an address indicated in the write request, determining membership of the bits that form at least a portion of the data in Q+1 different groupings of the bits, wherein a distributed bit grouping will be distributed across Q memory cells and each of Q non-distributed bit groupings will be stored in a corresponding one of the Q memory cells;
based on a first value of the distributed bit grouping, determining a list L of Q partitioned subset identifiers that maps to the distributed bit grouping, wherein each partitioned subset identifier $L_q$ in L corresponds to a different memory cell q of the Q memory cells;
for each of the Q non-distributed bit groupings,
determining which voltage threshold level n of a set of N voltage threshold levels maps to both a value of the non-distributed bit grouping and the partitioned subset identifier $L_q$ corresponding to the memory cell q that corresponds to the non-distributed bit grouping, wherein the set of N voltage threshold levels have been partitioned into K partitioned subsets each of which is identified by a different partitioned subset identifier for each of the memory cells; and writing to the memory cell q a voltage threshold corresponding to the voltage threshold level n.

10. The system of claim 9 wherein the controller is further programmed to:
based on a read request to read data from an address, reading Q memory cells corresponding to the address and determining a voltage threshold level n based on the reading;
determining Q values for Q non-distributed bit groupings of the Q read memory cells that map to the voltage threshold level n;
for each read memory cell q, determining a partitioned subset identifier $L_q$ that maps to the voltage threshold level n determined from the reading;
mapping the Q determined partitioned subset identifiers $L_q$ to a value for a distributed bit grouping value; and
assembling the Q values and the value for the distributed bit grouping into a word for the read request.

11. The system of claim 9 wherein determining membership of the bits that form at least a portion of the data in different groupings of the bits comprises accessing a set of one or more tables that defines grouping by bit position.

12. The system of claim 11 further comprising instructions stored thereon that are executable by a controller to perform operations comprising defining bit groupings by bit position.

13. The system of claim 9 further comprising instructions stored thereon that are executable by a controller to perform operations comprising partitioning the set of N voltage threshold levels into the K partitioned subsets to prevent adjacent voltage threshold levels from being within a same partitioned subset.

14. The system of claim 9, wherein determining membership of the bits that form at least a portion of the data in different groupings of the bits comprises dividing the data into words each having (Q*M+P) bits per word, wherein P is a number of bits in the distributed bit grouping, and M is the number of bits that can be stored in each of the memory cells.

15. The system of claim 14 further comprising instructions stored thereon that are executable by a controller to perform operations comprising determining P to satisfy $2^P < K^Q$, wherein N=K*2M.

16. The system of claim 9 further comprising instructions stored thereon that are executable by a controller to perform operations comprising determining the voltage threshold corresponding to the determined voltage threshold level.

17. A solid state storage device comprising:
solid state memory cells; and
a controller programmed to,
based on a write request to write data to an address indicated in the write request, determine membership of the bits that form at least a portion of the data in Q+1 different groupings of the bits, wherein a distributed bit grouping will be distributed across Q memory cells and each of Q non-distributed bit groupings will be stored in a corresponding one of the Q memory cells;
based on a first value of the distributed bit grouping, determine a list L of Q partitioned subset identifiers that maps to the distributed bit grouping, wherein each partitioned subset identifier $L_q$ in L corresponds to a different memory cell q of the Q memory cells;
for each of the Q non-distributed bit groupings,
determine which voltage threshold level n of a set of N voltage threshold levels maps to both a value of the non-distributed bit grouping and the partitioned subset identifier $L_q$ corresponding to the memory cell q that corresponds to the non-distributed bit grouping, wherein the set of N voltage threshold levels have been partitioned into K partitioned subsets each of which is identified by a different partitioned subset identifier for each of the memory cells; and
write to the memory cell q a voltage threshold corresponding to the voltage threshold level n.

18. The solid state storage device of claim 17, further comprising a machine-readable medium that has instructions stored thereon that are executable by a processor to:
based on a read request to read data from an address, read Q memory cells corresponding to the address and determine a voltage threshold level n based on the reading;
determine Q values for Q non-distributed bit groupings of the Q read memory cells that map to the voltage threshold level n;
for each read memory cell q, determine a partitioned subset identifier $L_q$ that maps to the voltage threshold level n determined from the reading;
map the Q determined partitioned subset identifiers $L_q$ to a value for a distributed bit grouping value; and
assemble the Q values and the value for the distributed bit grouping into a word for the read request.

19. The solid state storage device of claim 17, further comprising a machine-readable medium that has instructions stored thereon that are executable by a processor to partition the set of N voltage threshold levels into the K partitioned subsets to prevent adjacent voltage threshold levels from being within a same partitioned subset.

20. The solid state storage device of claim 17, further comprising a machine-readable medium that has instructions stored thereon that are executable by a processor to determine membership of the bits that form at least a portion of the data in different groupings of the bits comprise instructions to divide the data into words each having (Q*M+P) bits per word, wherein P is a number of bits in the distributed bit grouping, and M is the number of bits that can be stored in each of the memory cells.

* * * * *